(12) United States Patent
Zhang et al.

(10) Patent No.: US 11,011,656 B2
(45) Date of Patent: May 18, 2021

(54) PHOTODIODE DEVICE AND PHOTODIODE DETECTOR

(71) Applicant: NUCTECH COMPANY LIMITED, Beijing (CN)

(72) Inventors: Lan Zhang, Beijing (CN); Haifan Hu, Beijing (CN); Xuepeng Cao, Beijing (CN); Jun Li, Beijing (CN)

(73) Assignee: NUCTECH COMPANY LIMITED, Beijing (CN)

( * ) Notice: Subject to any disclaimer, the term of this patent is extended or adjusted under 35 U.S.C. 154(b) by 0 days.

(21) Appl. No.: 16/467,623

(22) PCT Filed: Aug. 8, 2017

(86) PCT No.: PCT/CN2017/096404
§ 371 (c)(1),
(2) Date: Jun. 7, 2019

(87) PCT Pub. No.: WO2018/103358
PCT Pub. Date: Jun. 14, 2018

(65) Prior Publication Data
US 2019/0326458 A1 Oct. 24, 2019

(30) Foreign Application Priority Data
Dec. 7, 2016 (CN) .......................... 201611143007.4

(51) Int. Cl.
*H01L 31/0352* (2006.01)
*H01L 27/146* (2006.01)
*H01L 31/0224* (2006.01)
*H01L 31/0232* (2014.01)
*H01L 31/103* (2006.01)

(52) U.S. Cl.
CPC ...... *H01L 31/0352* (2013.01); *H01L 27/1463* (2013.01); *H01L 27/14605* (2013.01);
(Continued)

(58) Field of Classification Search
CPC .......... H01L 31/0352; H01L 27/14605; H01L 27/1463; H01L 31/022408;
(Continued)

(56) References Cited

U.S. PATENT DOCUMENTS

| 4,639,756 A | 1/1987 | Rosbeck et al. |
| 5,438,217 A | 8/1995 | Ishaque et al. |

(Continued)

FOREIGN PATENT DOCUMENTS

| CN | 1508885 A | 6/2004 |
| CN | 101794798 A | 8/2010 |
| CN | 106847958 A | 6/2017 |

OTHER PUBLICATIONS

Partial Supplementary European Search Report for corresponding European Patent Application No. 17879355.0 dated May 14, 2020, 12 pages.

(Continued)

*Primary Examiner* — Shahed Ahmed
(74) *Attorney, Agent, or Firm* — Merchant & Gould P.C.

(57) ABSTRACT

A photodiode device and a photodiode detector are provided. According to an embodiment, the photodiode device may include a first type lightly doped semiconductor base including a first surface and a second surfaces opposite to each other, a first electrode region being first type heavily doped and disposed on the first surface of the semiconductor base, a second electrode region being second type heavily doped and disposed on the second surface of the semiconductor base, wherein the first surface is a light incident surface.

18 Claims, 11 Drawing Sheets

(52) U.S. Cl.
CPC ............... *H01L 31/02327* (2013.01); *H01L 31/022408* (2013.01); *H01L 31/103* (2013.01); *H01L 27/14663* (2013.01)

(58) Field of Classification Search
CPC ............ H01L 31/02327; H01L 31/103; H01L 27/14663; H01L 31/1013; H01L 31/1016; H01L 31/145–153; H01L 31/165–173; H01L 27/14643–14663; H01L 27/14603; H01L 27/14658; H01L 31/105; H01L 31/03529; H01L 31/109
See application file for complete search history.

(56) References Cited

U.S. PATENT DOCUMENTS

| | | | |
|---|---|---|---|
| 6,204,087 B1* | 3/2001 | Parker | ................ H01L 27/1446 257/E27.129 |
| 6,380,550 B1* | 4/2002 | Canham | ................ H01L 33/346 257/3 |
| 2003/0034496 A1 | 2/2003 | Yoneta et al. | |
| 2006/0267054 A1* | 11/2006 | Martin | .............. H01L 27/14632 257/291 |
| 2007/0164333 A1* | 7/2007 | Wright | .................... H01L 27/12 257/292 |
| 2016/0111580 A1 | 4/2016 | Gravrand et al. | |
| 2016/0231600 A1* | 8/2016 | Harada | ................... G02F 1/015 |
| 2019/0081251 A1* | 3/2019 | Obana | ................ H01L 51/0074 |

OTHER PUBLICATIONS

International Search Report and Written Opinion of the International Searching Authority for International Patent Application No. PCT/CN2017/096404 dated Nov. 15, 2017, 10 pages.

Extended European Search Report for corresponding European Patent Application No. 17879355.0 dated Aug. 20, 2020, 10 pages.

* cited by examiner

PHOTODIODE DEVICE AND PHOTODIODE DETECTOR

CROSS-REFERENCE TO RELATED APPLICATION(S)

This application is a National Stage Application of PCT/CN2017/096404, filed on Aug. 8, 2017, which claims benefit of Chinese Patent Application No. 201611143007.4, filed on Dec. 7, 2016, the disclosures of which are incorporated herein in by reference in their entireties. A claim of priority is made to each of the above disclosed applications.

TECHNICAL FIELD

The present disclosure relates to a photodetector device, and more particularly, to a photodiode device and a photodiode detector having improved performance.

BACKGROUND

A semiconductor photodiode array may be used to detect incident light (e.g., directly incident light rays, or visible light rays generated by X-rays in a scintillator) by the incident light ionizing atoms in a semiconductor and thereby generating unbalanced carriers. Parameters that measure the performance of the photodiode array may include resolution, signal-to-noise ratio, readout speed, photoresponse, and charge crosstalk between pixels, etc.

Therefore, there is a need to provide new structures to improve, at least in part, the performance of photodiode devices or photodiode arrays.

SUMMARY

In view of the above, the present disclosure aims to provide, among others, a photodiode device and a photodiode detector having improved performance.

According to an aspect of the present disclosure, there is provided a photodiode device including: a first type lightly doped semiconductor base including a first surface and a second surfaces opposite to each other; a first electrode region being first type heavily doped and disposed on the first surface of the semiconductor base; a second electrode region being second type heavily doped and disposed on the second surface of the semiconductor base, wherein the first surface is a light incident surface.

According to another aspect of the present disclosure, there is provided a photodiode detector including an array including a plurality of photodiode devices according to the above aspect.

According to embodiments of the present disclosure, at least some of the following improvements can be achieved. Specifically, the charge collection time is effectively increased, the photoresponse of the photodiode array is enhanced, and charge crosstalk between pixels is reduced when detecting incident light.

BRIEF DESCRIPTION OF THE DRAWINGS

The above and other objects, features and advantages of the present disclosure will become more apparent from the following description of embodiments of the present disclosure made with reference to the accompanying drawings, in which.

Throughout the drawings, like or similar reference numerals indicate like or similar elements.

DETAILED DESCRIPTION

Hereinafter, embodiments of the present disclosure will be described with reference to the accompanying drawings. It should be understood, however, that the description is only illustrative, and is not intended to limit the scope of the disclosure. In addition, descriptions of well-known structures and techniques are omitted in the following description in order to avoid unnecessarily obscuring the concept of the present disclosure.

Various structures in accordance with embodiments of the present disclosure are schematically depicted in the accompanying drawings. Those figures are not drawn to scale, and some details may be enlarged and some details may be omitted for clarity of illustration. The shapes of various regions and layers, and the relative sizes thereof and the positional relationship therebetween are merely exemplary, and may vary in practice due to fabrication tolerances or technical limitations. Those skilled in the art may design further regions/layers having different shapes, sizes, and relative positions as desired.

In the context of the present disclosure, when a layer/element is referred to as being "on" another layer/element, the layer/element may be directly on the other layer/element, or there may be an intermediate layer/element interposed therebetween. In addition, if a layer/element is "above" another layer/element in an orientation, the layer/element may be "under" the other layer/element when the orientation is turned.

Figure 1A:
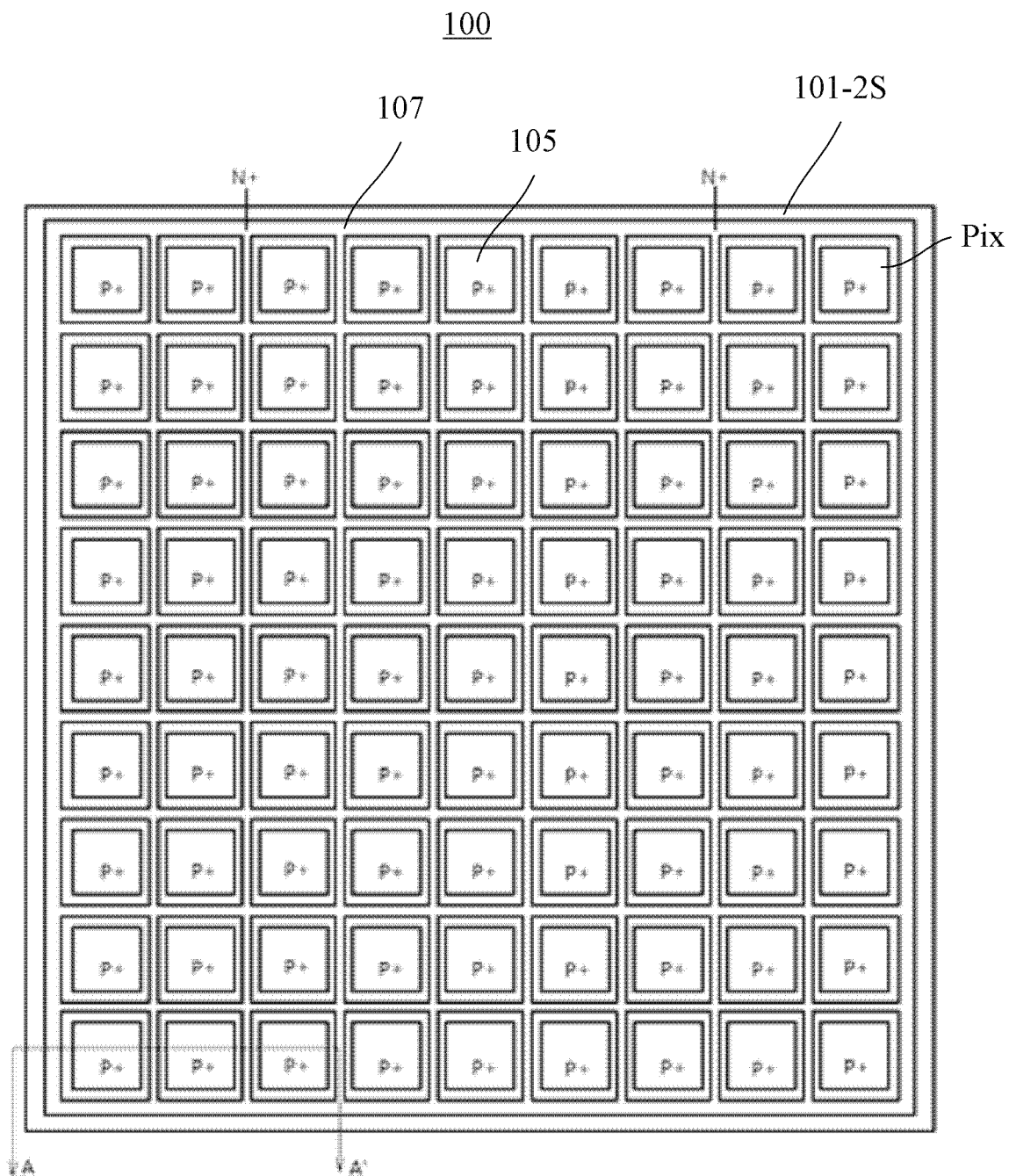
FIG. 1A depicts a top view of a photodiode detector in accordance with an embodiment of the present disclosure.
Figure 1B:
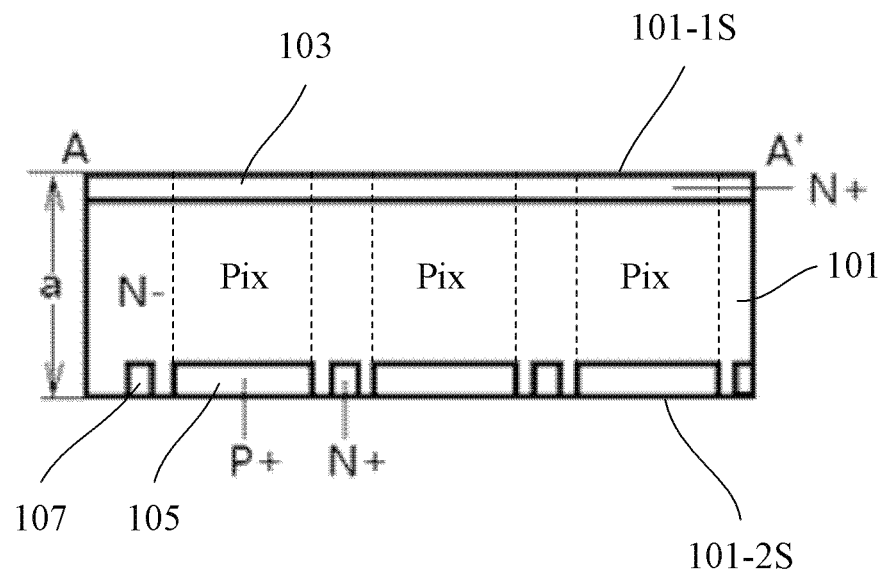
FIG. 1B depicts a cross-sectional view taken along line AA' shown in FIG. 1A.

FIG. 1A depicts a top view of a photodiode detector in accordance with an embodiment of the present disclosure, and FIG. 1B depicts a cross-sectional view taken along line AA' shown in FIG. 1A.

As shown in FIGS. 1A and 1B, a photodiode detector 100 according to the embodiment may include a plurality of photodiode devices Pixs formed on a semiconductor base 101, each of which may constitute one pixel of the photodiode detector 100. The semiconductor base 101 may include various suitable semiconductor materials, for example, a silicon (Si) wafer. The semiconductor base 101 may include two surfaces opposite to each other, a first surface 101-1S and a second surface 101-2S. These two surfaces may be substantially parallel to each other, and have a distance a (i.e., a thickness of the semiconductor base 101) of about 50 to 300 μm therebetween. The semiconductor base 101 may be doped to a suitable conductivity type, such as a first type (e.g., N-type).

The photodiode device Pix may include a first electrode region 103 formed on the first surface 101-1S and a second electrode region 105 formed on the second surface 101-2S. Here, the second electrode region 105 may be doped to a different conductivity type than the semiconductor base 101, for example, a second type (e.g., P-type), thereby forming a PN junction together with the semiconductor base 101. Correspondingly, the first electrode region 103 may be doped to the same conductivity type as that of the semiconductor base, for example, the first type (e.g., N-type). As such, in the case where the first type is N-type and the second type is P-type, the first electrode region 103 may constitute a cathode of the photodiode device Pix, and the second electrode region 105 may constitute an anode of the photodiode device Pix. According to an embodiment of the present disclosure, the first electrode region 103 and the second electrode region 105 may be heavily doped. On the contrary, the semiconductor base 101 may be the lightly doped, and thus the two heavily doped regions can be prevented from being directly adjacent to each other. Therefore, the tunneling effect can be suppressed.

For example, the first electrode region 103 may have a thickness of about 0.3-3 μm, and the second electrode region 105 may have a thickness of about 0.3-3 μm. In addition, the first electrode region 103 and the second electrode region 105 may have a distance of, for example, about 10-200 μm therebetween.

Incident light may be incident onto the photodiode device Pix from the first surface 101-1S. The photodiode device Pix may operate in a reverse bias mode. In this case, a relatively wide space charge region under the reverse bias condition may be formed in the vicinity of a light collecting active region (the region near the incident surface 101-1S) in the pixel. Alternatively, the photodiode device Pix may operate in a zero bias mode. In this case, a relatively narrow built-in space charge region under the zero bias condition may be formed in the vicinity of the light collecting active region in the pixel. Electrodes may be led out from the first electrode region 103 and the second electrode region 105, respectively, so as to apply a bias voltage thereto and/or read a signal therefrom.

The incident light may collide with and ionize silicon atoms in the semiconductor base 101 in the light collecting active region, thereby generating electron-hole pairs. The electrons may drift or diffuse toward the first electrode region 103 under a built-in electric field or a biasing electric field externally applied, and may eventually be collected by the first electrode region 103. In addition, the holes may drift or diffuse toward the second electrode region 105 under the built-in electric field or the biasing electric field externally applied, and may eventually be collected by the second electrode region 105. An electrical signal may be read from the second electrode region 105, and information about the incident light (e.g., intensity of the incident light) can be obtained therefrom.

Here, the first electrode region 103 and/or the second electrode region 105 each may be a doped region formed on the semiconductor base 101, for example, by ion implantation, or an epitaxial region formed by epitaxial growth (it may be doped in situ during the epitaxial growth process), or the like. There are various ways in the art to form a specific type of doped region in/on a defined region of a semiconductor base. In addition, in the photodiode detector 100, the first electrode regions 103 of the respective photodiode devices Pixs may be connected to each other, such that they may be formed integral with each other. The second electrode regions 105 of the respective photodiode devices Pixs may be separated from each other and arranged, for example, in an array form in rows and columns.

Here, the terms "highly doped" and "lightly doped" are relative terms. For example, "highly doped" means a doping concentration above about $1 \times 10^{17}$ cm$^{-3}$, and "lightly doped" means a doping concentration below about $1 \times 10^{17}$ cm$^{-3}$. In addition, the semiconductor base 101, after being first type lightly doped, may have a high resistance, for example, a resistivity of about $100$-$8 \times 10^3$ Ω·cm. To conduct the first type (e.g., N-type) of doping, N-type dopants such as phosphorus (P) or arsenic (As) may be used; and to conduct the second type (e.g., P-type) of doping, P-type dopants such as boron (B) may be used.

According to an embodiment of the present disclosure, inter-pixel isolation 107 may be further disposed between adjacent photodiode devices Pixs. For example, the isolation 107 may be first type heavily doped, and may have a thickness substantially the same as that of the second electrode region 105. The isolation 107 may be formed to surround the respective second electrode regions 105 of the respective photodiode devices Pixs, so that the active regions of the respective pixels may be separated from each other. As such, charge crosstalk between the pixels may be suppressed and thus position resolution of photons may be improved.

Figure 1C:
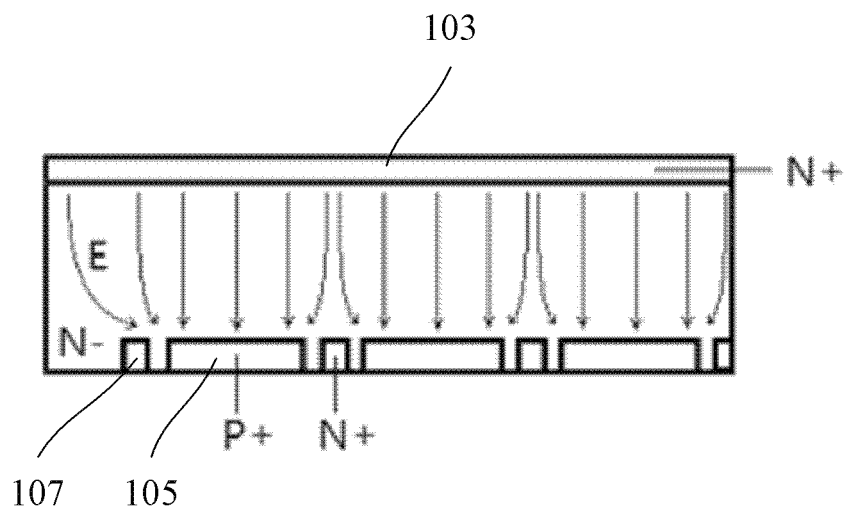
FIG. 1C depicts a schematic electric field distribution in the photodiode detector shown in FIG. 1A.

FIG. 1C depicts a schematic electric field distribution in the photodiode detector shown in FIG. 1A. When the photodiode detector 100 is in the zero bias state or reverse bias state, an internal electric field is directed from the N+ layer at the first surface 101-1S to the P+ regions for hole charge collection. In addition, the electric field is also directed from the N+ region between the pixels to the P+ regions for hole charge collection.

In the embodiment shown in FIGS. 1A-1C, when the incident light is incident from the N+ layer at the first surface 101-1S of the photodiode detector 100, hole carriers generated therein must drift through the entire thickness of the semiconductor base so as to be collected by the P+ type semiconductor region in the pixel.

To further improve the performance of the device, a protruding structure that is connected to the second electrode region and protrudes from the second electrode region toward the first surface may be provided according to an embodiment of the present disclosure. The protruding structure may also be second type heavily doped so as to form, for example, a hole carrier collecting mechanism together with the second electrode. With this protruding structure, it is possible to reduce the distance between the hole carriers and their collecting mechanism, and thus to accelerate the absorption of the hole carriers and reduce the trapping of the carriers by defects of the semiconductor base, so as to increase the photo induced output current.

Such a protruding structure may be variously disposed, and some examples thereof will be described below.

Figure 2A:
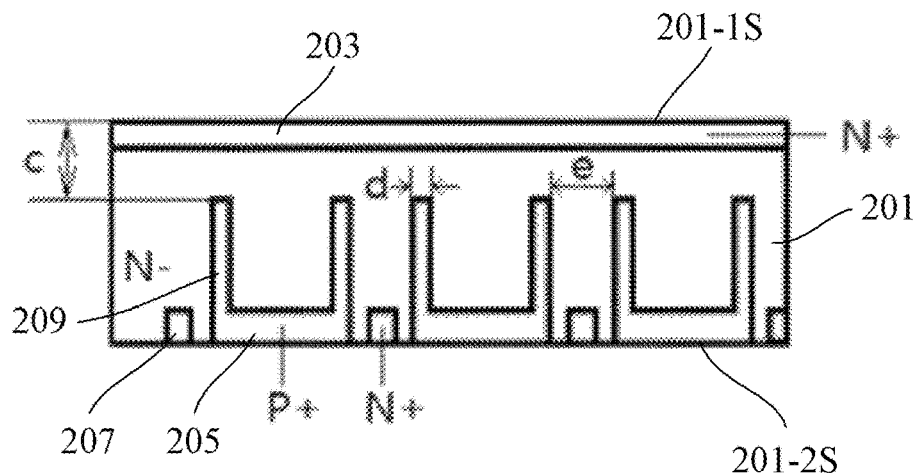
FIG. 2A depicts a cross-sectional view of a photodiode detector in accordance with another embodiment of the present disclosure.

FIG. 2A depicts a cross-sectional view of a photodiode detector in accordance with another embodiment of the present disclosure.

As shown in FIG. 2A, the photodiode detector according to this embodiment may include a plurality of photodiode devices formed on a semiconductor base 201, each of which may include a first electrode region 203 formed on a first surface 201-1S of the semiconductor base 201 and a second electrode region 205 formed on a second surface 201-2S of the semiconductor base 201. In addition, inter-pixel isolation 207 may be disposed between the second electrode regions 205 of adjacent photodiode devices. For more details of these elements, reference may be made to the description made above in connection with FIGS. 1A and 1B.

Additionally, each of the photodiode devices may also include a protruding structure 209 connected to the second electrode region 205. The protruding structure 209 may be substantially perpendicular to the second electrode region 205. Here, the protruding structure 209 may be a second type heavily doped region in the semiconductor base 201. Such a doped region may be formed in the semiconductor base 201 by, for example, ion implantation, or by forming a trench in the semiconductor base 201 and filling up the trench with a second type heavily doped semiconductor material. Hereinafter, the trench-type protruding structure will be further described in detail.

In this example, the protruding structure 209 may be formed along a periphery of the second electrode region 205 to at least partially surround the periphery of the second electrode region 205. FIG. 2C depicts schematic top views of protruding structures applicable to the photodiode detector shown in FIG. 2A. For example, as shown in part (a) of FIG. 2C, the protruding structure 209 may completely surround the periphery of the second electrode region 205 to form a ring-shaped fence structure, thereby forming a semi-enclosed structure surrounding an active region of a respective pixel together with the second electrode region 205. Certainly, the protruding structure 209 does not necessarily completely surround the periphery of the second electrode region 205, but may be formed along only a portion of the periphery of the second electrode region 205. For example, as shown in part (b) of FIG. 2C, the protruding structure 209 may include a pair of protruding structures oppositely disposed along the periphery of the second electrode region 205 (in particular, when the second electrode region 205 is in a rectangular shape, they may be disposed on a pair of opposite sides of the rectangle). Certainly, the present disclosure is not limited thereto. For example, the protruding structure 209 may be formed on more portions or less portions of the periphery of the second electrode region 205.

In one example, a distance c from the end of the protruding structure 209 to the first surface 101-1S may be about 5-100 μm, the protruding structure 209 may have a width d of about 0.5-10 μm, and the protruding structures may have a pitch e of about 5-50 μm among the pixels. Since visible light generated from X-rays passing through a scintillator may have a wavelength in the range of 400 nm to 600 nm and a absorption depth in the silicon device no greater than 1 μm, the protruding structure would not reduce the absorption of photo-generated carriers. On the other hand, since the end of the P+ collection region is closer to the light incident surface and the distance of the hole carriers in the semiconductor base to the P+ collection region is thus reduced, the absorption of the hole carriers is accelerated, and the trapping of the carriers by defects of the semiconductor base is reduced, thereby increasing the photo induced output current.

Figure 2B:
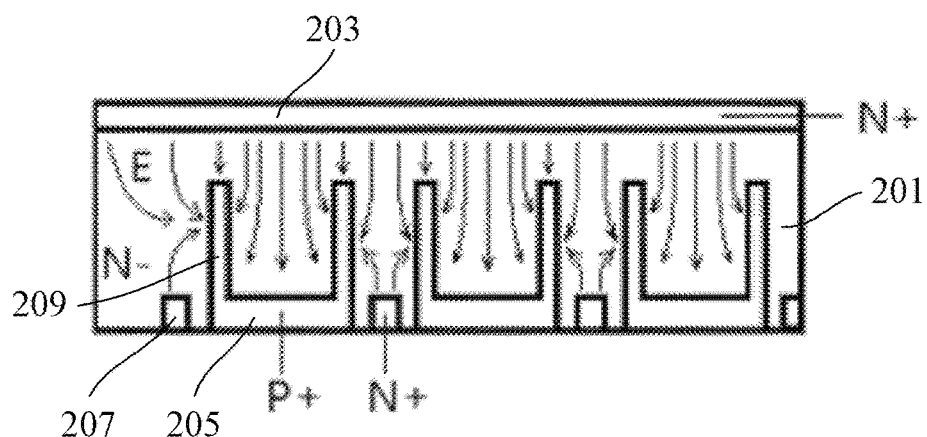
FIG. 2B depicts a schematic electric field distribution in the photodiode detector shown in FIG. 2A.
Figure 2C:
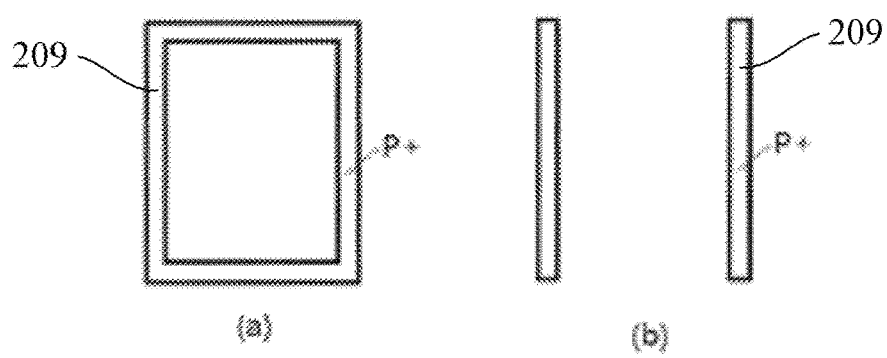
FIG. 2C depicts schematic top views of a protruding structure applicable to the photodiode detector shown in FIG. 2A.

FIG. 2B depicts a schematic electric field distribution in the photodiode detector shown in FIG. 2A.

As shown in FIG. 2B, an internal electric field is also directed from the N+ semiconductor region to the P+ semiconductor region. However, due to the P+ protruding structure located at the edge of the active region of the pixel, electric field lines start to diverge and be directed to side walls of the P+ protruding structure after entering the space surrounded by the P+ protruding structure in the pixel. It can be seen that most of the electric field lines have their respective length reduced, which means that the paths of the holes drifting to the P+ collection region are shortened, that is, the collection time of the hole charges by the P+ collection region is reduced. In addition, the holes diffused into the space surrounded by the P+ protruding structure cannot be easily collected by the P+ collection regions of adjacent pixels, and thus the charge collection efficiency of a target pixel can be improved and meanwhile the charge crosstalk effect between the pixels can be reduced.

According to an embodiment of the present disclosure, one or more additional protruding structures formed on the inner side of the periphery of the second electrode region may be included, in addition to the protruding structure formed along the periphery of the second electrode region. The additional protruding structure(s) may likewise be connected to the second electrode region and may be second type heavily doped. Similarly, the additional protruding structure(s) may be formed to at least partially surround a portion of the second electrode region, or alternatively may form a grid structure together with the protruding structure formed along the periphery.

Figure 3A:
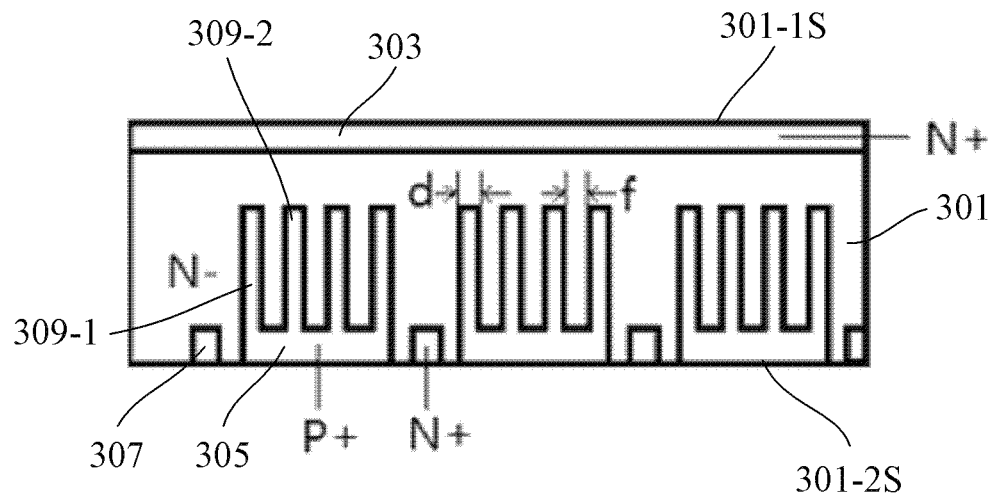
FIG. 3A depicts a cross-sectional view of a photodiode detector in accordance with another embodiment of the present disclosure.
Figure 3B:
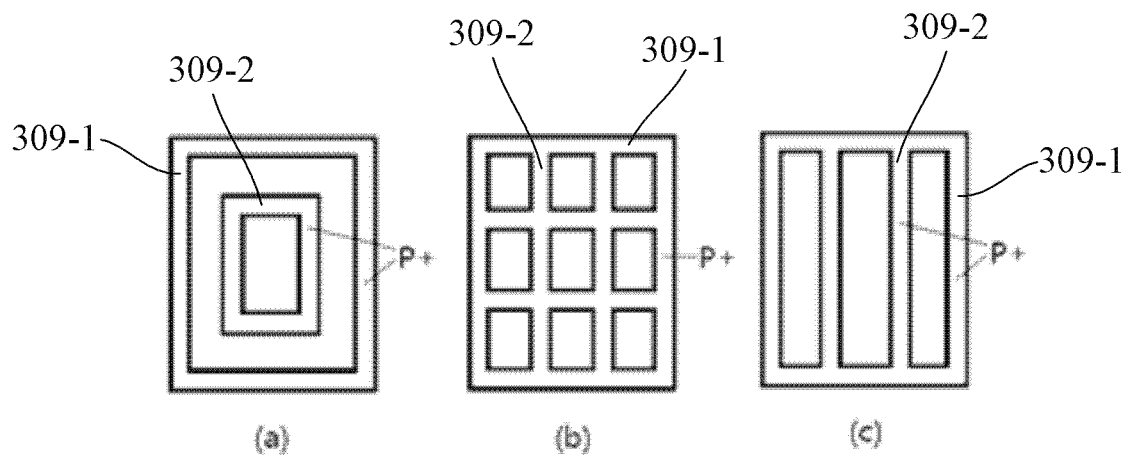
FIG. 3B depicts schematic top views of a protruding structure applicable to the photodiode detector shown in FIG. 3A.

FIG. 3A depicts a cross-sectional view of a photodiode detector in accordance with another embodiment of the present disclosure, and FIG. 3B depicts schematic top views of protruding structures applicable to the photodiode detector shown in FIG. 3A As shown in FIG. 3A, the photodiode detector according to this embodiment may include a plurality of photodiode devices formed on a semiconductor base 301, each of which may include a first electrode region 303 formed on a first surface 301-1S of the semiconductor base 301 and a second electrode region 305 formed on a second surface 301-2S of the semiconductor base 301. In addition, inter-pixel isolation 307 may be disposed between the second electrode regions 305 of adjacent photodiode devices. For more details of these elements, reference may be made to the description made above in connection with FIGS. 1A and 1B.

In addition, each of the photodiode devices may further include a protruding structure connected to the second electrode region 305, including a protruding structure 309-1 formed along a periphery of the second electrode region 305 and a protruding structure 309-2 formed on the inner side of the periphery of the second electrode region 305. For more details of the protruding structure 309-1, reference may be made to, for example, the description made above in connection with FIGS. 2A, 2B and 2C. In addition, as shown in the top views of FIG. 3B, the protruding structure 309-2 may divide an active region of a corresponding pixel (for example, surrounded by the protruding structure 309-1) into a plurality of regions (by forming a ring-shaped structure, as shown in part (a) of FIG. 3B, or by forming a grid structure as shown in parts (b) and (c) of FIG. 3B). In one example, each of the protruding structures may have a width d of about 0.5-10 μm, and the protruding structures within each pixel may have a pitch f of about 10-500 μm therebetween. In this example, the respective protruding structures 309-1 and 309-2 may have substantially the same protruding length, that is, depth (a dimension extending from the second surface toward the first surface).

The photo-induced carriers may enter the respective divided regions within the active region of the pixel when they drift in the semiconductor base, and thus the distance of the hole carriers drifting to the nearest P+ collection region may be further reduced. As a result, the absorption of the hole carriers in the active region can be distributed substantially evenly, so as to reduce the collection time of the carriers, reduce the probability that the hole carriers are trapped by the semiconductor base, and enhance the photo-response intensity.

Figure 4A:
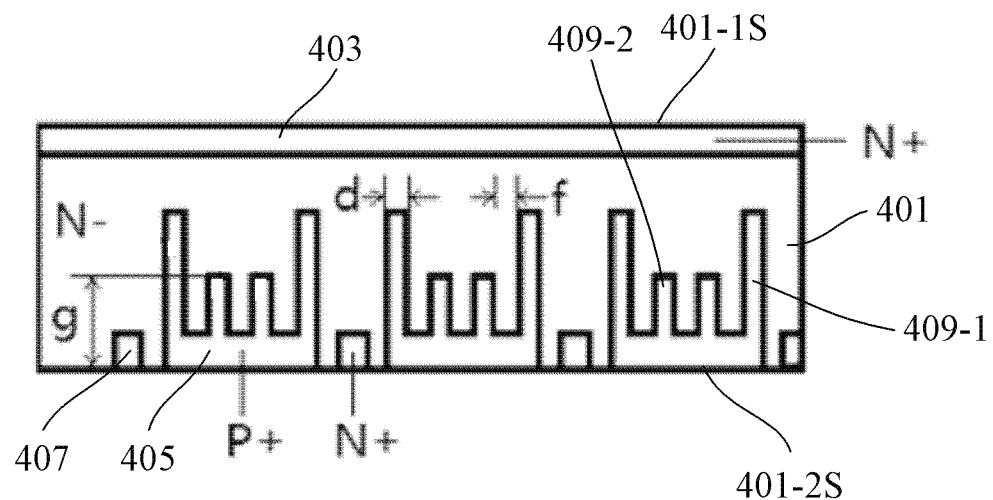
FIG. 4A depicts a cross-sectional view of a photodiode detector in accordance with another embodiment of the present disclosure.
Figure 4B:
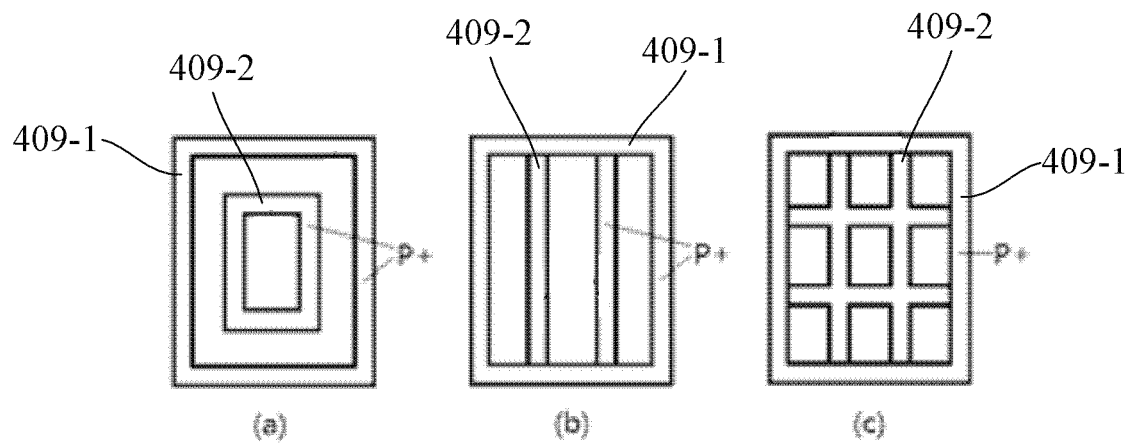
FIG. 4B depicts schematic top views of a protruding structure applicable to the photodiode detector shown in FIG. 4A.

FIG. 4A depicts a cross-sectional view of a photodiode detector in accordance with another embodiment of the present disclosure, and FIG. 4B depicts schematic top views of protruding structures applicable to the photodiode detector shown in FIG. 4A.

As shown in FIGS. 4A and 4B, the photodiode detector according to this embodiment may include a plurality of photodiode devices formed on a semiconductor base 401, each of which may include a first electrode region 403 formed on a first surface 401-1S of the semiconductor base 401 and a second electrode region 405 formed on a second surface 401-2S of the semiconductor base 401. In addition, inter-pixel isolation 407 may be disposed between the second electrode regions 405 of adjacent photodiode devices. For more details of these elements, reference may be made to the description made above in connection with FIGS. 1A and 1B.

In addition, each of the photodiode devices may further include a protruding structure connected to the second electrode region 405, including a protruding structure 409-1 formed along a periphery of the second electrode region 405 and a protruding structure 409-2 formed on the inner side of the periphery of the second electrode region 405. For more details of the protruding structures, reference may be made to, for example, the description made above in connection with FIGS. 3A and 3B.

In this embodiment, the protruding structures 409-2 formed on the inner side of the periphery of the second electrode region 405 may have a depth smaller than that of the protruding structure 409-1 formed along the periphery of the second electrode region 405. The protruding structures 409-2 may have substantially the same depth.

In the above embodiments, the protruding structure is formed in a fence-like configuration, but the present disclosure is not limited thereto. According to other embodiments of the present disclosure, the protruding structure may be formed as a columnar structure (which appears to be a dot-shaped structure in a top view). Such a columnar structure may be formed at any position within the second electrode region.

Figure 5A:
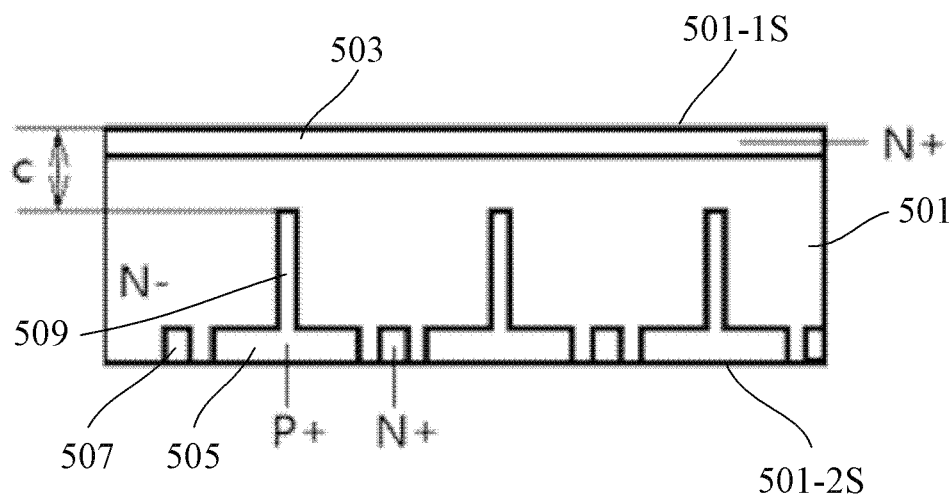
FIG. 5A depicts a cross-sectional view of a photodiode detector in accordance with another embodiment of the present disclosure.
Figure 5B:
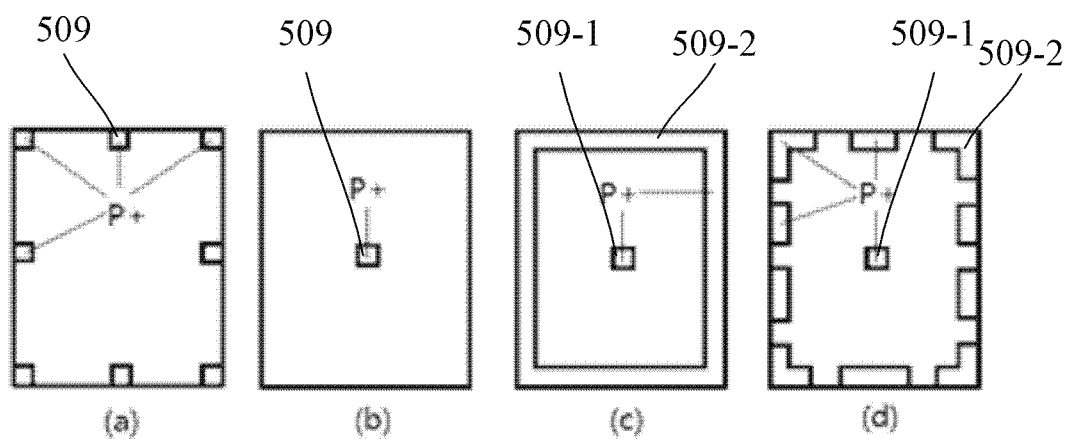
FIG. 5B depicts schematic top views of a protruding structure applicable to the photodiode detector shown in FIG. 5A.

FIG. 5A depicts a cross-sectional view of a photodiode detector in accordance with another embodiment of the present disclosure, and FIG. 5B depicts schematic top views of protruding structures applicable to the photodiode detector shown in FIG. 5A.

As shown in FIG. 5A, the photodiode detector according to this embodiment may include a plurality of photodiode devices formed on a semiconductor base 501, each of which may include a first electrode region 503 formed on a first surface 501-1S of the semiconductor base 501 and a second electrode region 505 formed on a second surface 501-2S of the semiconductor base 501. In addition, inter-pixel isolation 507 may be disposed between the second electrode regions 505 of adjacent photodiode devices. For more details of these elements, reference may be made to the description made above in connection with FIGS. 1A and 1B.

In addition, each of the photodiode devices may further include a columnar protruding structure 509 connected to the second electrode region 505. For example, a distance c between the end of the protruding structure 509 and the first surface 501-1S may be about 5 to 100 μm.

The distance of the hole carriers in the semiconductor base to the P+ collection region is reduced, because the end of the protruding structure 509 is closer to the light incident surface. As a result, the absorption of the hole carriers can be accelerated, the trapping of the carriers by defects in the semiconductor base can be reduced, and the photo induced output current can be enhanced.

For example, such a protruding structure 509 may be intermittently disposed along a periphery of the second electrode region 505 as shown in part (a) of FIG. 5B, or may be disposed on the inner side of the periphery of the second electrode region 505, for example, at a substantially central position of the second electrode region 505 as shown in part (b) of FIG. 5B. Certainly, the present disclosure is not limited to the configuration in which a single columnar protruding structure is disposed on the inner side of the periphery of the second electrode region 505. A plurality of columnar protruding structures may be disposed on the inner side of the periphery of the second electrode region 505. For example, an array of columnar protruding structures may be disposed in rows and columns.

Protruding structures may also be disposed at both the periphery of the second electrode region 505 and the inner side thereof, and such protruding structures may be fence structures and/or columnar structures. For example, as shown in part (d) of FIG. 5B, a columnar protruding structure 509-1 may be disposed at substantially the center of the second electrode region 505, and meanwhile a plurality of columnar protruding structures 509-2 may be disposed along the periphery of the second electrode region 505. At least a part of the protruding structures 509-2 may extend to a certain extent along the periphery of the second electrode region 505 such that the protruding structures 509-2 may appear to be a discontinuous fence structure as a whole. According to another example, the protruding structures 509-2 may extend to meet each other so as to constitute a continuous fence structure surrounding the periphery of the second electrode region 505, as shown in part (c) of FIG. 5B.

Certainly, the present disclosure is not limited thereto. A fence-like or columnar protruding structure may be suitably disposed. For example, a columnar protruding structure may be disposed on the outer side and a fence-like protruding structure may be disposed on the inner side; or alternatively, a columnar protruding structure may be disposed in a region divided by a fence-like protruding structure, and so on.

As described above, the protruding structure may be formed by firstly forming a trench in the semiconductor base and then filling the trench with a second type heavily doped semiconductor material.

Figure 6A:
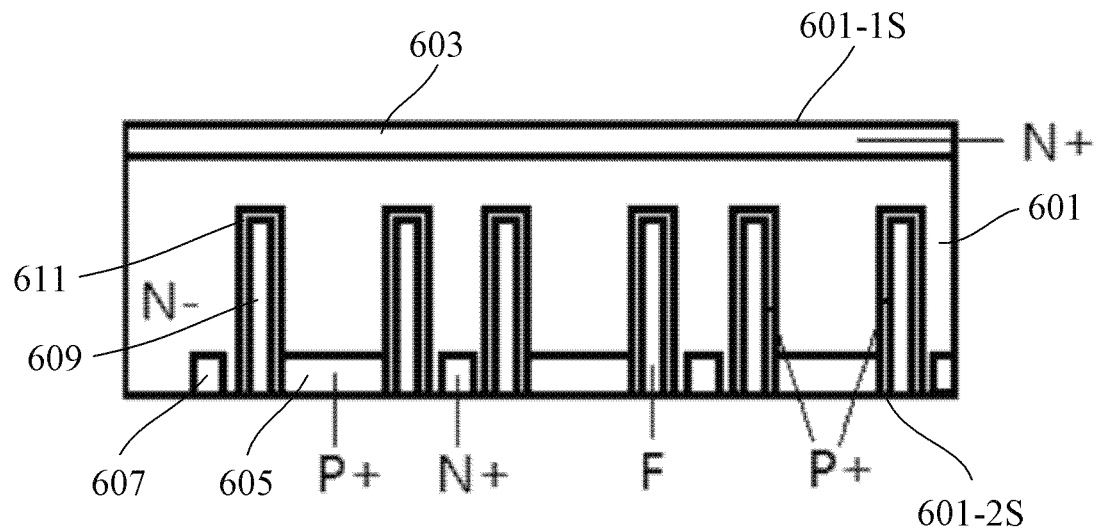
FIGS. 6A, 6B, and 6C depict cross-sectional views of photodiode detectors having a trench type protruding structure in accordance with various embodiments of the present disclosure.
Figure 6B:
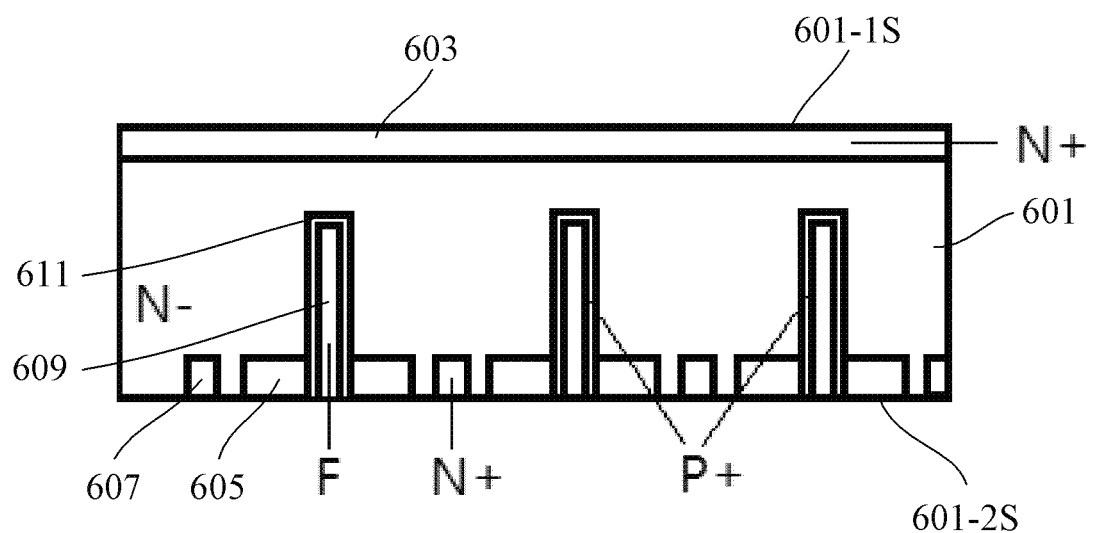
Figure 6C:
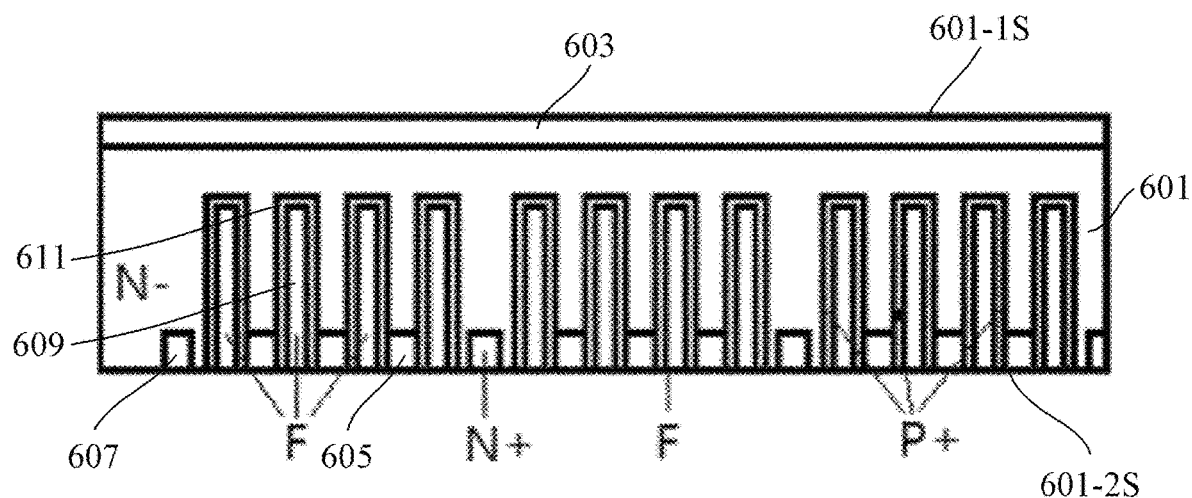

FIGS. 6A, 6B, and 6C depict cross-sectional views of photodiode detectors having a trench type protruding structure in accordance with various embodiments of the present disclosure.

As shown in FIGS. 6A, 6B, and 6C, the photodiode detector according to this embodiment may include a plurality of photodiode devices formed on a semiconductor base 601, each of which may include a first electrode region 603 formed on a first surface 601-1S of the semiconductor base 601 and a second electrode region 605 formed on a second surface 601-2S of the semiconductor base 601. Each of the photodiode devices may further include a protruding structure 609 connected to the second electrode region 605. In addition, inter-pixel isolation 607 may be disposed between the second electrode regions 605 of adjacent photodiode devices. For more details of these elements, reference may be made to the above description. Different layouts of the protruding structure 609 are shown in FIGS. 6A, 6B, and 6C. However, it is to be noted that the various layouts of the protruding structure described above are also applicable.

Here, the protruding structure 609 may be formed by firstly etching a trench F extending from the second surface 601-2S toward the first surface 601-1S (e.g., in a direction perpendicular to the surface) at the second surface 601-2S of the semiconductor base 601, and then filling the trench F with a (in this example, P+ doped) semiconductor material such as polysilicon (e.g., by deposition). Filling with P+ polysilicon not only enables electrode extraction, but also enhances the overall mechanical strength of the device.

In addition, many defects and irregularities may occur at the bottom and on sidewalls of the trench F after the trench F has been etched. According to an embodiment of the present disclosure, after a preliminary removal of sacrificial oxide, an implantation of heavy ions into the sidewalls of the trench may be conducted to form a region for a P+ layer. In this way, the probability of charge recombination at the sidewalls or bottom of the trench can be reduced, so that the charges can be collected directly by the electrode.

In addition, according to an embodiment of the present disclosure, the trench may extend to the first electrode region. In this case, the semiconductor material embedded in the trench may occupy only a fraction of a depth of the trench, and the end of the trench may be filled with a light reflective material.

Figure 7:
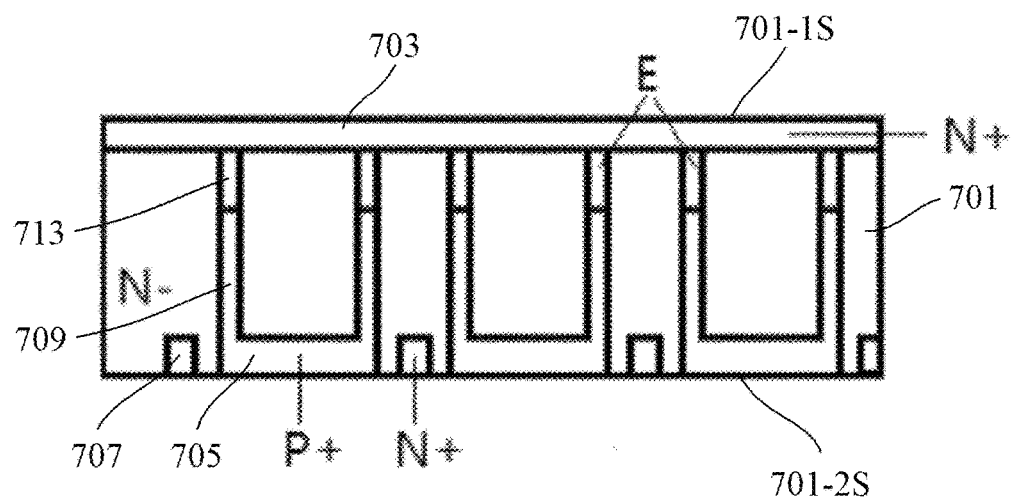
FIG. 7 depicts a cross-sectional view of a photodiode detector having a trench type protruding structure in accordance with another embodiment of the present disclosure.

FIG. 7 depicts a cross-sectional view of a photodiode detector having a trench type protruding structure in accordance with another embodiment of the present disclosure.

As shown in FIG. 7, the photodiode detector according to this embodiment may include a plurality of photodiode devices formed on a semiconductor base 701, each of which may include a first electrode region 703 formed on a first surface 701-1S of the semiconductor base 701 and a second electrode region 705 formed on a second surface 701-2S of the semiconductor base 701. Each of the photodiode devices may further include a protruding structure 709 connected to the second electrode region 705. In addition, inter-pixel isolation 707 may be disposed between the second electrode regions 705 of adjacent photodiode devices. For more details of these elements, reference may be made to the above description. Here, it is to be noted that the various layouts of the protruding structure described above are also applicable.

In this example, a reflecting structure 713 is formed in an end E of the trench close to the side of the first surface 701-1S. The reflecting structure 713 may include an insulating material or a second type heavily doped semiconductor material capable of reflecting incident light. For example, the semiconductor material for the reflecting structure 713 may include a material compatible with the silicon processes, for example, Ge, SiGe, SiC, or the like. In this way, it is possible to control the carriers diffused into the interior of the active region to be confined within the trench structure and thus ultimately collected by the P+ collection region.

Figure 8:
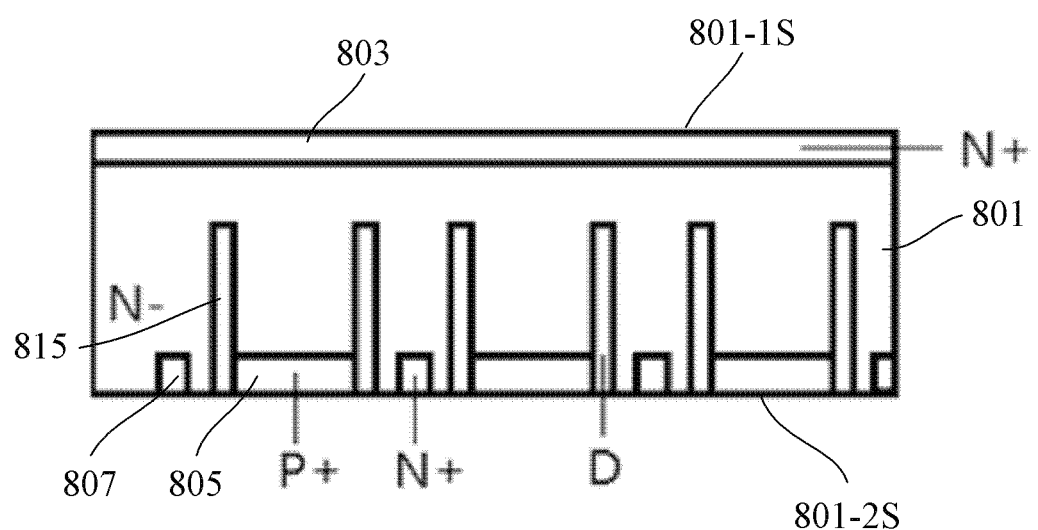
FIG. 8 depicts a cross-sectional view of a photodiode detector having a light reflecting structure in accordance with another embodiment of the present disclosure.

FIG. 8 depicts a cross-sectional view of a photodiode detector having a light reflecting structure in accordance with another embodiment of the present disclosure.

As shown in FIG. 8, the photodiode detector according to this embodiment may include a plurality of photodiode devices formed on a semiconductor base 801, each of which may include a first electrode region 803 formed on a first surface 801-1S of the semiconductor base 801 and a second electrode region 805 formed on a second surface 801-2S of the semiconductor base 801. Each of the photodiode devices may further include a protruding structure (not shown in FIG. 8) connected to the second electrode region 805. In addition, inter-pixel isolation 807 may be disposed between the second electrode regions 805 of adjacent photodiode devices. For more details of these elements, reference may be made to the above description.

In addition, a light reflecting structure 815 may be formed along a periphery of the second electrode region 805 to at least partially surrounds the periphery of the second electrode region 805 (preferably, completely surrounds the periphery of the second electrode region 805). The reflecting structure 815 may include an insulating material or a second type heavily doped semiconductor material capable of reflecting incident light. For example, the semiconductor material for the reflecting structure 815 may include a material compatible with the silicon processes, for example, Ge, SiGe, SiC, or the like.

The light reflecting structure 815 may protrude from the second surface 801-2S toward the first surface 801-1S, and have a depth greater than that of the second electrode region 805 (in the case where the protruding structure is formed, possibly greater than or equal to that of the protruding structure). Such a light reflecting structure 815 is particularly suitable for the case where no protruding structure is formed or protruding structures are not continuously formed along the periphery of the second electrode region 805 (for example, in a case where protruding structures are intermittently formed along the periphery of the second electrode region 805, the light reflecting structure 815 may be formed by filling a gap(s) between the protruding structures).

Similarly to the above embodiments, with such a light reflecting structure, it is possible to control the carriers diffused into the interior of the active region to be confined within the trench structure and thus ultimately collected by the P+ collection region.

In the above embodiments, the inter-pixel isolation 107, 207, 307, 407, 507, 607, 707, and 807 are formed not to protrude relative to the second electrode region (that is, having substantially the same depth as the second electrode region). According to further embodiments of the present disclosure, however, such inter-pixel isolation may protrude relative to the second electrode region.

Figure 9:
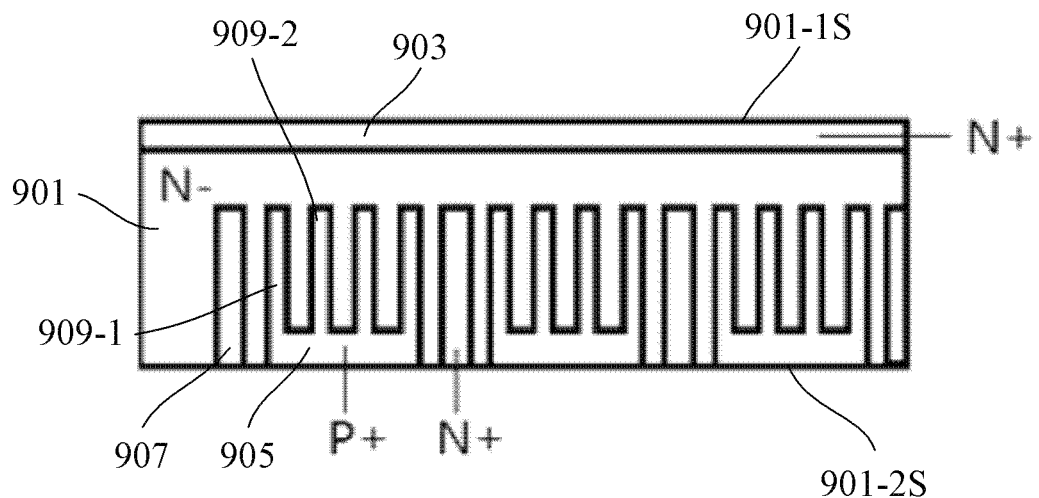
FIG. 9 depicts a cross-sectional view of a photodiode detector having elongated isolation in accordance with another embodiment of the present disclosure.

FIG. 9 depicts a cross-sectional view of a photodiode detector having elongated isolation in accordance with another embodiment of the present disclosure.

As shown in FIG. 9, the photodiode detector according to this embodiment may include a plurality of photodiode devices formed on a semiconductor base 901, each of which may include a first electrode region 903 formed on a first surface 901-1S of the semiconductor base 901 and a second electrode region 905 formed on a second surface 901-2S of the semiconductor base 901. Each of the photodiode devices may further include a protruding structure 909 connected to the second electrode region 905. In addition, inter-pixel isolation 907 may be disposed between the second electrode regions 905 of adjacent photodiode devices. For more details of these elements, reference may be made to the above description. Here, it is to be noted that the various layouts of the protruding structure described above are also applicable.

In this example, the inter-pixel isolation 907 protrudes relative to the second electrode region 905, for example, by having substantially the same depth as the protruding structure 909. In this way, the inter-pixel isolation 907 can surround the P+ collection region in the active region of each pixel, and sufficiently isolate the active region spaces of the respective pixels, thereby reducing charge crosstalk between the pixels and improving position resolution of photons.

In addition, according to other embodiments of the present disclosure, isolation may be disposed on an outer periphery of an array, but not between pixels within the array, especially in a case where a protruding structure(s) surrounding a periphery of the pixel is formed.

Figure 10:
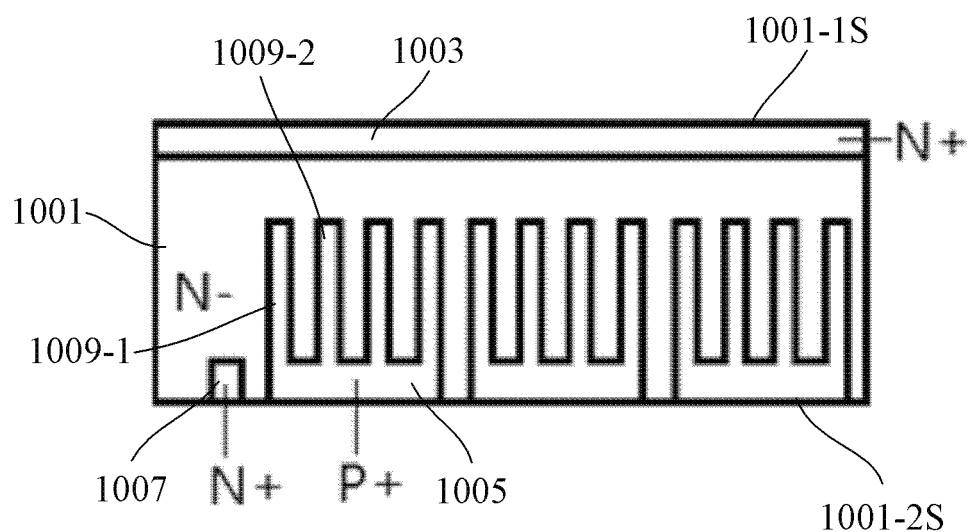
FIG. 10 depicts a cross-sectional view of a photodiode detector having isolation at an outer periphery thereof in accordance with another embodiment of the present disclosure.

FIG. 10 depicts a cross-sectional view of a photodiode detector having isolation at an outer periphery thereof in accordance with another embodiment of the present disclosure.

As shown in FIG. 10, the photodiode detector according to this embodiment may include a plurality of photodiode devices formed on a semiconductor base 1001, each of which may include a first electrode region 1003 formed on a first surface 1001-1S of the semiconductor base 1001 and a second electrode region 1005 formed on a second surface 1001-2S of the semiconductor base 1001. Each of the photodiode devices may further include protruding structures 1009-1 and 1009-2 connected to the second electrode region 1005. For more details of these elements, reference may be made to the above description. Here, it is to be noted that the various layouts of the protruding structure described above are also applicable.

In this example, isolation 1007 is disposed on an outer periphery of the array, while pixels within the array may be adjacent to each other. The isolation 1007 may or may not protrude relative to the second electrode region 1005. In this way, the active regions of the respective pixels can be expanded and/or the pitches between the pixels can be reduced.

Figure 11:
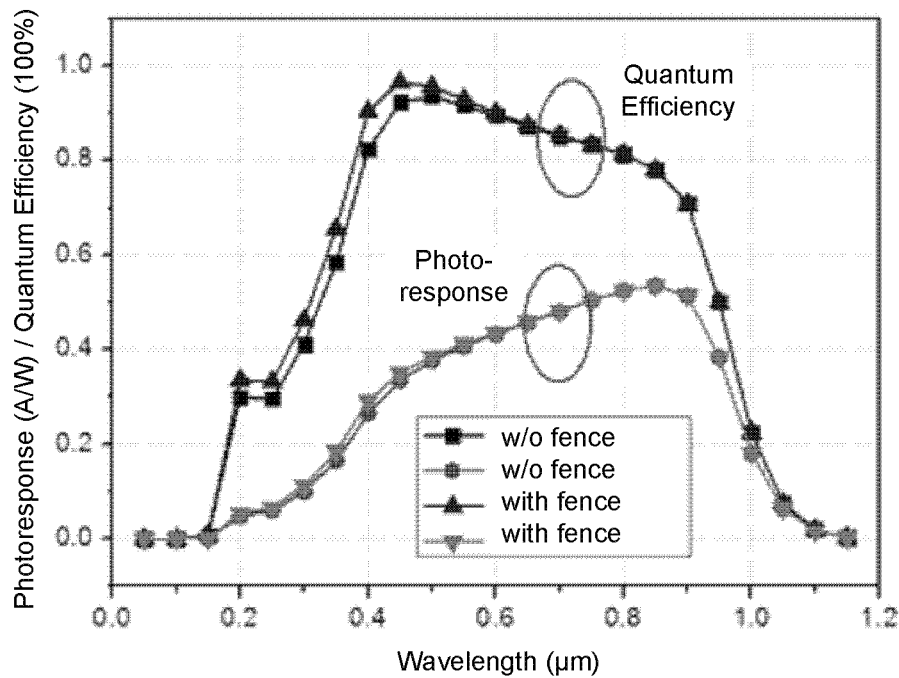
FIG. 11 is a graph schematically illustrating a comparison between a photodiode detector in accordance with an embodiment of the present disclosure and a conventional photodiode detector in terms of light collection efficiency and photoresponse.
Figure 12:
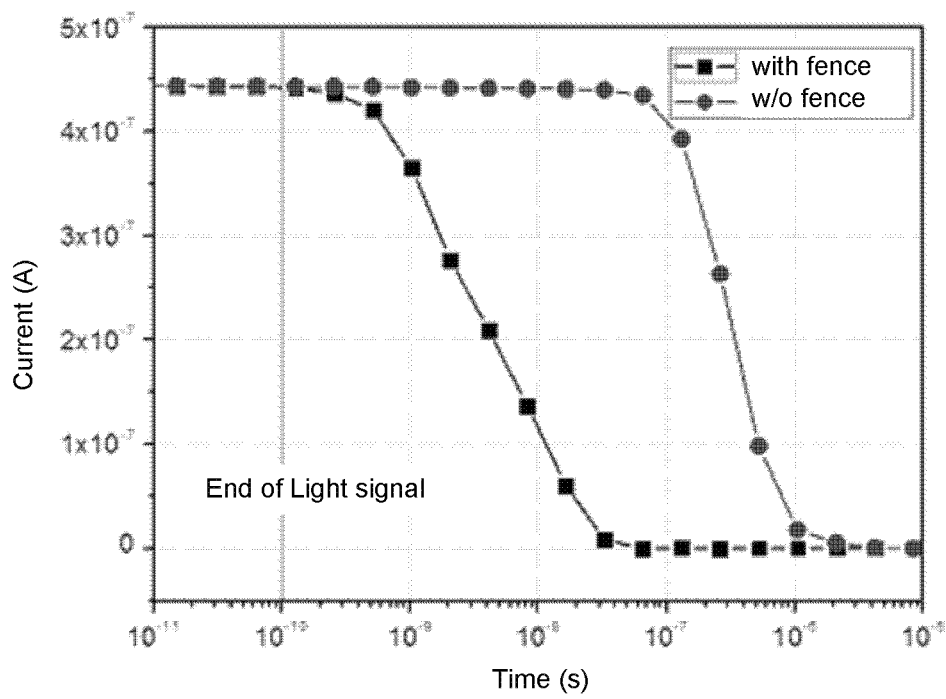
FIG. 12 is a graph schematically illustrating a comparison between a photodiode detector in accordance with an embodiment of the present disclosure and a conventional photodiode detector in terms of charge collection speed.

FIGS. 11 and 12 are graphs schematically illustrating a comparison between a photodiode detector in accordance with an embodiment of the present disclosure and a conventional photodiode detector in terms of light collection efficiency, photoresponse, and charge collection speed. Here, both the detectors being compared have the same structural parameters, but one of them has a protruding structure according to the present disclosure, while the other does not have such a protruding structure. Moreover, it is assumed that the optical signal stops at time 0.1 ns.

As shown in FIGS. 11 and 12, the photoresponse and quantum efficiency of detector with a fence structure are higher than those of the detector without the fence structure in the wavelength range of 400 nm to 600 nm. In addition, the charge collection time of the photodiode array with the fence structure is significantly shorter than that of the photodiode array without the fence structure. Therefore, the structure according to the present disclosure can effectively improve the charge collection ability and reduce the charge collection time.

Although the various embodiments have been separately described above, this does not necessarily mean that the measures in the respective embodiments cannot be used in combination to advantage.

The embodiments of the present disclosure have been described above. However, those embodiments are for illustrative purposes only and are not intended to limit the scope of the disclosure. The scope of the disclosure is defined by the appended claims and their equivalents. Numerous alternatives and modifications may be made therein by those skilled in the art without departing from the scope of the present disclosure, and all fall within the scope of the present disclosure.

We claim:

1. A photodiode device, comprising:
   a first type lightly doped semiconductor base comprising a first surface and a second surfaces opposite to each other, wherein the first surface is a light incident surface;
   a first electrode region being first type heavily doped and disposed on the first surface of the semiconductor base;
   a second electrode region being second type heavily doped and disposed on the second surface of the semiconductor base; and
   a protruding structure connected to the second electrode region and protruding from the second electrode region toward the first surface, wherein the protruding structure is second type heavily doped, wherein the protruding structure is formed to at least partially surround a periphery of the second electrode region.

2. The photodiode device of claim 1, wherein the protruding structure comprises a semiconductor material embedded in a trench formed at the second surface and extending from the second surface toward the first surface.

3. The photodiode device of claim 2, wherein the trench comprises a sidewall having an ion implanted region being second type heavily doped therein.

4. The photodiode device of claim 2, wherein the trench extends to the first electrode region, the semiconductor material embedded in the trench occupies a fraction of a depth of the trench, and an end of the trench on a side of the first surface is filled with a light reflective material.

5. The photodiode device of claim 1, wherein the protruding structure is substantially perpendicular to the second electrode region.

6. The photodiode device of claim 1, wherein the protruding structure comprises a ring-shaped fence structure formed along the periphery of the second electrode region, or comprises a pair of protruding structures oppositely disposed along the periphery of the second electrode region.

7. The photodiode device of claim 1, further comprising one or more additional protruding structures formed on the inner side of the periphery of the second electrode region, wherein the additional protruding structures are formed to at least partially surround a portion of the second electrode region.

8. The photodiode device of claim 7, wherein the protruding structure forms a grid configuration together with the additional protruding structures, wherein the protruding structure has substantially the same extension length as the additional protruding structures.

9. The photodiode device of claim 7, wherein the protruding structure has an extension length that is greater than that of the additional protruding structures.

10. The photodiode device of claim 1, wherein the protruding structure comprises a columnar structure formed at the second electrode region, wherein the columnar structure is disposed at a substantially central position of the second electrode region.

11. The photodiode device of claim 10, wherein the columnar structure is plural in number, and wherein the plural columnar structures are disposed along the periphery of the second electrode region.

12. The photodiode device of claim 11, wherein at least one or more of the plural columnar structures disposed along the periphery of the second electrode region extend along the periphery of the second electrode region to a certain extent.

13. The photodiode device of claim 12, wherein the plural columnar structures disposed along the periphery of the second electrode region are connected to each other, thereby forming a fence structure surrounding the periphery of the second electrode region.

14. The photodiode device of claim 1, further comprising a light reflecting structure formed to at least partially surround the periphery of the second electrode region and extending from the second electrode region toward the first surface.

15. A photodiode detector, comprising:
an array comprising a plurality of photodiode devices according to claim 1, wherein the first electrode regions of the respective photodiode devices are connected to each other, while the second electrode regions of the respective photodiode devices are separated from each other.

16. The photodiode detector of claim 15, further comprising inter-pixel isolation disposed between the second electrode regions of adjacent photodiode devices and being first type heavily doped.

17. The photodiode detector of claim 15, further comprising isolation disposed on an outer periphery of the array and being first type heavily doped.

18. The photodiode detector of claim 16, wherein the isolation has substantially the same depth as the second electrode region or protrudes toward the first surface relative to the second electrode region.

* * * * *